United States Patent [19]

Yoshida

[11] Patent Number: 5,083,043
[45] Date of Patent: Jan. 21, 1992

[54] VOLTAGE CONTROL CIRCUIT FOR A SEMICONDUCTOR APPARATUS CAPABLE OF CONTROLLING AN OUTPUT VOLTAGE

[75] Inventor: Makoto Yoshida, Nara, Japan

[73] Assignee: Sharp Kabushiki Kaisha, Osaka, Japan

[21] Appl. No.: 642,898

[22] Filed: Jan. 18, 1991

[30] Foreign Application Priority Data

Jan. 18, 1990 [JP] Japan .................................. 2-9527

[51] Int. Cl.$^5$ ................................................. H03K 3/01
[52] U.S. Cl. .................................. 307/296.8; 307/242; 307/571; 323/303
[58] Field of Search ...................... 323/299, 303, 281; 307/296.8, 241, 242, 264, 296.6, 139, 125, 571

[56] References Cited

U.S. PATENT DOCUMENTS

| | | | |
|---|---|---|---|
| 4,017,779 | 4/1977 | McDonald et al. | 323/303 X |
| 4,652,808 | 3/1987 | Mostyn et al. | 323/299 X |
| 4,779,037 | 10/1988 | Lo Cascio | 323/303 X |
| 4,906,913 | 3/1990 | Stanojevic | 323/303 |

*Primary Examiner*—Stanley D. Miller
*Assistant Examiner*—Toan Tran

[57] ABSTRACT

There is disclosed a voltage control circuit for a semiconductor apparatus for controlling an output voltage to be applied from an external voltage source to a load circuit of the semiconductor apparatus therethrough. A reference voltage generator generates a predetermined reference voltage according to a source voltage outputted from an external voltage source, and an error amplifier compares the output voltage with the reference voltage, and outputs a comparison signal for representing the comparison result thereof. A voltage controller controls the output voltage according to the comparison signal. Further, a diode circuit which is connected in parallel with the voltage controller applies the source voltage to the load circuit in a forward direction thereof. Furthermore, a first switching device enables the reference voltage generator, the error amplifier and the voltage controlled in response to a first control signal outputted from an external circuit, and for disabling the reference voltage generator, the error amplifier and the voltage controller in response to a second control signal outputted from the external circuit. Also, a second switching device enables the diode circuit in response to the second control signal, and for disabling the diode circuit in response to the first control signal.

8 Claims, 2 Drawing Sheets

VOLTAGE CONTROL CIRCUIT FOR A SEMICONDUCTOR APPARATUS CAPABLE OF CONTROLLING AN OUTPUT VOLTAGE

BACKGROUND OF THE INVENTION

1. Field of the Invention

The present invention relates to a voltage control circuit for a semiconductor apparatus such as an integrated circuit (referred to as an IC hereinafter), a large scale integrated circuit, and more particularly, to a voltage control circuit for a semiconductor apparatus capable of controlling an output voltage to be applied to a load circuit thereof.

2. Description of the Related Art

FIG. 1 is a circuit diagram showing a voltage control circuit 10 of a conventional IC.

Referring to FIG. 1, the conventional IC comprises the voltage control circuit 10, and a load circuit 3 for performing a predetermined operation, which are mounted in a package of the conventional IC. The voltage control circuit 10 comprises a reference voltage generator 1, an error amplifier 2 comprising four metal oxide semiconductor field effect transistors T2 to T5, and a control transistor T1 of a metal oxide semiconductor field effect transistor. The metal oxide semiconductor field effect transistor is referred to as a MOSFET hereinafter. In the conventional IC, an external voltage source +Vcc for outputting a predetermined direct-current source voltage is electrically connected through the control transistor T1 to the load circuit 3.

The reference voltage generator 1 comprises two resistors R1 and R2 for dividing the source voltage outputted from the external voltage source +Vcc into a predetermined direct-current reference voltage with a dividing voltage ratio of $R2/(R1+R2)$, and applying the divided reference voltage to the error amplifier 2. The error amplifier 2 compares an output voltage to be applied from the external voltage source +Vcc through the control transistor T1 to the load circuit 3, with the reference voltage outputted from the reference voltage generator 1, and drives the control transistor T1 according to the comparison result thereof.

In the conventional IC as described above, even though there is a large change in a load current flowing from the voltage source +Vcc to the load circuit 3, the load circuit 3 can receive a predetermined stable voltage from the voltage source +Vcc through the voltage control circuit 10 since the output voltage is controlled so as to keep a predetermined constant voltage.

However, in the conventional voltage control circuit, even though it is not necessary to supply a large current to the load circuit 3, an unnecessary current always flows in the error amplifier 2 and the reference voltage generator 1.

As a result, when the conventional voltage control circuit 10 of this type is provided in an IC of an electronic apparatus to which electric power is supplied from a battery such as a portable electronic apparatus, there is such a problem that the life of the battery becomes shortened since the above-mentioned unnecessary current flows therein even though the load circuit 3 which is an internal circuit of the IC does not require a relatively large current.

SUMMARY OF THE INVENTION

An essential object of the present invention is to provide a voltage control circuit of a semiconductor apparatus capable of supplying a direct-current electric power to a load circuit provided in the semiconductor apparatus without uselessly consuming an electric power.

In order to accomplish the above objects, according to one aspect of the present invention, there is provided a voltage control circuit for a semiconductor apparatus for controlling an output voltage to be applied from an external voltage source to a load circuit of said semiconductor apparatus therethrough, includes:

reference voltage generating means for generating a predetermined reference voltage according to a source voltage outputted from an external voltage source.

There is comparing means for comparing said output voltage to be applied to said load circuit with said reference voltage generated by said reference voltage generating means, and outputting a comparison signal for representing said comparison result thereof. Also in the apparatus is voltage control means for controlling said output voltage to be applied to said load circuit according to said comparison signal outputted from said comparing means; and diode means for applying said source voltage outputted from said external voltage source to said load circuit in a forward direction thereof, said diode means being connected in parallel with said voltage control means. Two switch means are provided with the first switching means for enabling said reference voltage generating means, said comparing means and said voltage control means in response to a first control signal outputted from an external circuit when said load circuit requires a relatively large current equal to or larger than a predetermined threshold current, and for disabling said reference voltage generating means, said comparing means and said voltage control means in response to a second control signal outputted from said external circuit when said load circuit requires a relatively small current smaller than said predetermined threshold current; and second switching means for enabling said diode means in response to said second control signal, and for disabling said diode means in response to said first control signal.

In said voltage control circuit for said semiconductor apparatus, when said load circuit requires said relatively large current, said external circuit outputs said second control signal to said first and second switching means. At that time, said first switching means enables said reference voltage generating means, said comparing means and said voltage control means, and also said second switching means disable said diode means. Therefore, said source voltage outputted from said external voltage source is controlled by said voltage control means according to said comparison signal outputted from said comparing means, and then, said controlled source voltage is applied as said output voltage to said load circuit through said voltage control means with said relatively large current flowing in said load circuit.

On the other hand, when said load circuit requires said relatively small current, said external circuit outputs said second control signal to said first and second switching means. At that time, said first switching means disables said reference voltage generating means, said comparing means and said voltage control means, and also said second switching means enables said diode means. Therefore, said source voltage outputted from said external voltage source is not controlled by said voltage control means according to said comparison signal outputted from said comparing means, and is applied as said output voltage to said load circuit through said diode means with said relatively small current flowing in said load circuit.

In the latter case, since said reference voltage generating means and said comparing means are disabled as described above, the above-mentioned useless consumption of the electric power which is caused in the conventional voltage control circuit 10 can be prevented. Accordingly, for example, when said voltage control circuit of the present invention is provided in an IC etc. of a portable electronic apparatus which is driven by a battery, the life of the battery can be lengthened.

According to another aspect of the present invention, in said circuit, said semiconductor apparatus is an integrated circuit to which a chip enable signal is inputted from said external circuit, said first control signal corresponds to said chip enable signal having a first level, and said second control signal corresponds to said chip enable signal having a second level which is different from said first level.

According to a further aspect of the present invention, in said circuit, said first switching means comprises:

a first transistor for controlling the action of said said reference signal generating means;

a second transistor for controlling the action of said comparing means; and a third transistor for controlling the action of said voltage control means, and said second switching means comprises a fourth transistor for controlling the action of said diode means.

According to a still further aspect of the present invention, in said circuit, said first transistor is an N type metal oxide semiconductor field effect transistor;

said second transistor is an N type metal oxide semiconductor field effect transistor;

said third transistor is a P type metal oxide semiconductor field effect transistor; and said fourth transistor is a P type metal oxide semiconductor field effect transistor.

According to a more still further aspect of the present invention, in said circuit, said comparing means is an error amplifier, and said voltage control means is a field effect transistor.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

A preferred embodiment according to the present invention will be described below with reference to the attached drawings.

Figure 1:
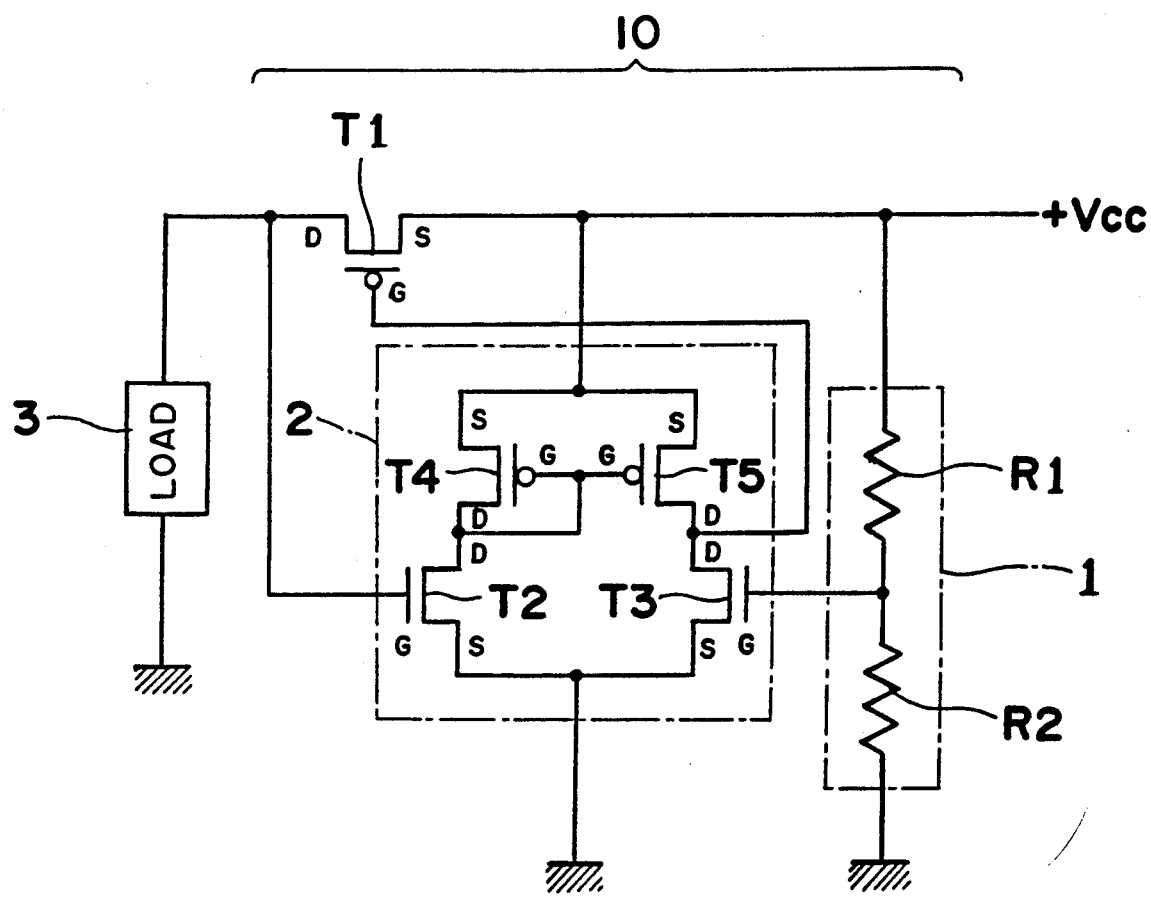
FIG. 1 is a circuit diagram of a voltage control circuit of a conventional IC.
Figure 2:
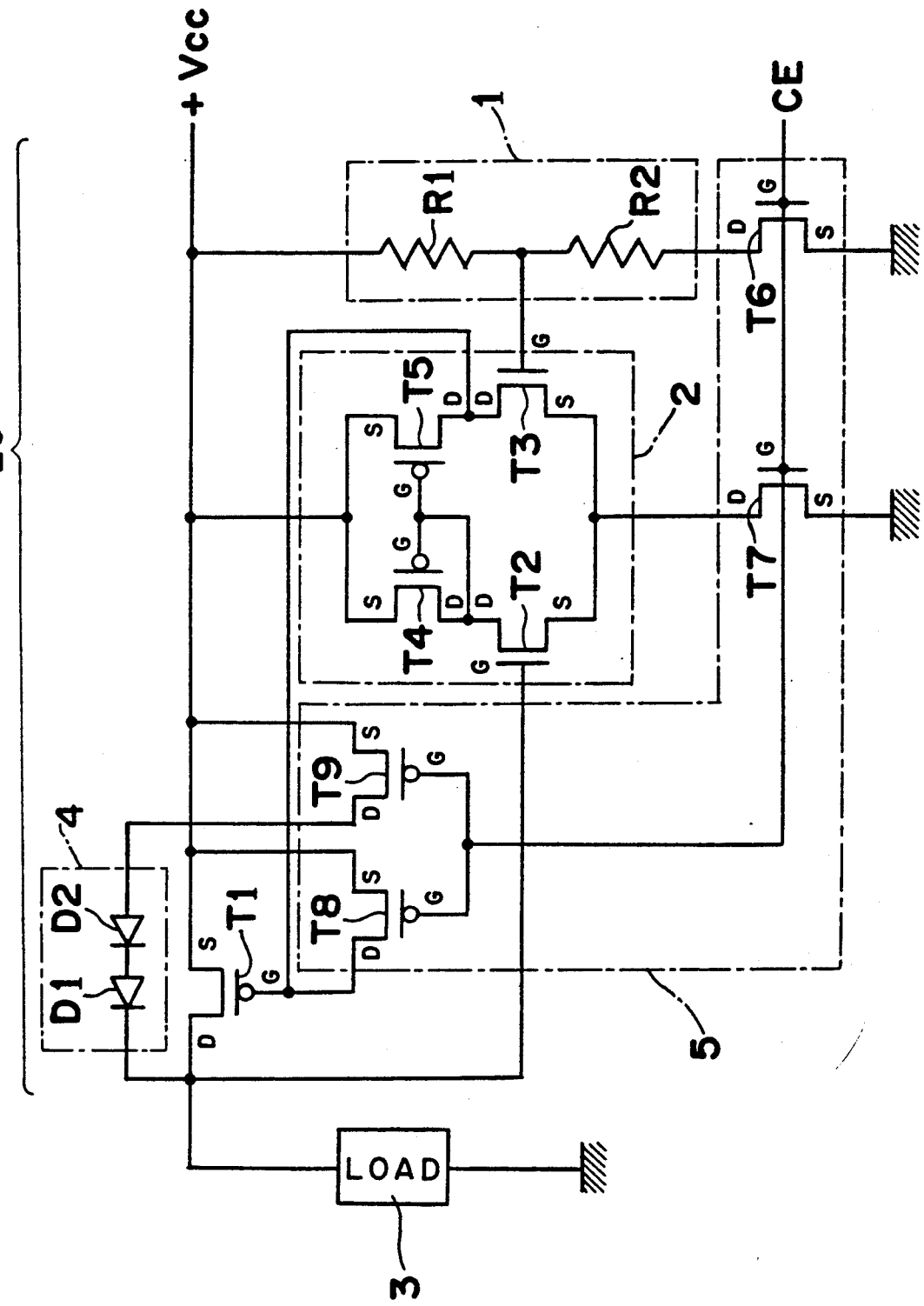
FIG. 2 is a circuit diagram of a voltage control circuit of an IC of a preferred embodiment according to the present invention.

FIG. 2 is a circuit diagram of a voltage control circuit 20 of an IC of a preferred embodiment according to the present invention. In FIG. 2, the same components as those shown in FIG. 1 are denoted by the same numerals as those shown in FIG. 1.

Referring to FIG. 2, the IC of the present preferred embodiment comprises the voltage control circuit 20 and a load circuit 3 for performing a predetermined operation, which are mounted in a package of the IC. The voltage control circuit 20 is characterized in comprising a diode circuit 4 and a switching circuit 5, in addition to a reference voltage generator 1, an error amplifier 2, a control transistor T1 of a P type MOSFET, which are provided in the conventional voltage control circuit 10 shown in FIG. 1.

In the IC, an external voltage source +Vcc for outputting a predetermined direct-current source voltage is electrically connected through the source and the drain of the control transistor T1 to the load circuit 3. The reference voltage generator 1 comprises two resistors R1 and R2, which are connected in series. The error amplifier 2 comprises two transistors T2 and T3 each of which is an N type MOSFET, and two transistors T4 and T5 each of which is a P type MOSFET. The diode circuit 4 comprises two diodes D1 and D2, which are connected in series so that the anode of the diode D1 is electrically connected to the cathode of the diode D2. The switching circuit 5 comprises two switching transistors T6 and T7 each of which is an N type MOSFET, and two switching transistors T8 and T9 each of which is a P type MOSFET.

The reference voltage generator 1 is provided for dividing the source voltage outputted from the external voltage source +Vcc into a predetermined direct-current reference voltage with a dividing voltage ratio of R2/(R1+R2), and applying the divided reference voltage to the gate of the transistor T3 of the error amplifier 2. One end of the resistor R2 which is not connected to the resistor R1 is connected to ground through the drain and source of the switching transistor T6 of the switching circuit 5.

In the error amplifier 5, respective sources of the transistors T4 and T5 are connected to the external voltage source +Vcc. Respective gates of the the transistors T4 and T5 are connected to each other and to respective drains of the transistors T2 and T4. Respective drains of the transistors T3 and T5 are connected to each other and to the gate of the transistor T1 and the drain of the switching transistor T8. Respective sources of the transistors T2 and T3 are connected to each other and to ground through the drain and the source of the switching transistor T7 of the switching circuit 5. The gate of the transistor T2 is connected to the drain of the transistor T1. The error amplifier 2 compares the source voltage outputted from the external voltage source +Vcc with the reference voltage outputted from the reference voltage generator 1, and drives the control transistor T1 according to the comparison result thereof so as to keep the output voltage of a predetermined constant voltage, which is applied to the load circuit 3.

In the conventional IC constructed as described above, even though there is caused a large change in a load current flowing from the voltage source +Vcc to the load circuit 3, the load circuit 3 can received a predetermined stable voltage from the voltage source +Vcc through the voltage control circuit.

In the diode circuit 4, the cathode of the diode D1 is connected to the drain of the control transistor T1, and the anode of the diode D2 is connected to the drain of the switching transistor T9.

In the switching circuit 5, a chip enable signal CE outputted from an external circuit is inputted to respective gates of the switching transistors T6 to T9. When the load circuit 3 requires a relatively large current larger than a predetermined threshold current, the chip enable signal CE becomes a high level. On the other hand, when the load circuit 3 does not require the above-mentioned relatively large current, the chip enable signal CE becomes a low level. Further, respective sources of the switching transistors T8 and T9 are connected to the external voltage source +Vcc. Namely, the switching transistor T6 is connected between the reference circuit 1 and ground, and the switching transistor T7 is connected between the error amplifier 2 and ground. Furthermore, the switching transistor T8 is connected between the external voltage source +Vcc and the gate of the control transistor T1, and the switching transistor T9 is connected between the external voltage source +Vcc and the anode of the diode D2 the diode circuit 4.

In the voltage control circuit 20 constructed as described above, when the load circuit 3 requires the above-mentioned relatively large current, the chip enable signal CE becomes a high level as described above, and then, the switching transistors T6 and T7 are turned on and the switching transistors T8 and T9 are turned off. At that time, the reference voltage generator 1, the error amplifier 2 and the control transistor T1 operate in a manner similar to that of the voltage control circuit 10 shown in FIG. 1. Namely, the reference voltage generator 1 generates a predetermined direct-current reference voltage according to the source voltage outputted from the external voltage source +Vcc. Also, the error amplifier 2 compares an output voltage to be applied from the external voltage source +Vcc through the control transistor T1 to the load circuit 3, and controls the above output voltage according to the comparison result thereof.

Further, when the control transistor T1 is turned on, the switching transistor T9 is turned off, and then, the diode circuit 4 is turned off. At that time, there is no relationship between the operations of the control transistor T1 and the error amplifier 2.

Accordingly, when the load circuit 3 requires the above-mentioned relatively large current, a predetermined stable constant voltage can be applied to the load circuit 3 even though there is a large change in the load current flowing in the load circuit 3.

On the other hand, when the load circuit 3 does not require the above-mentioned relatively current, the chip enable signal CE becomes the low level as described above, and then, the switching transistors T6 and T7 are turned off and the switching transistors T8 and T9 are turned on. Then, the electric power is not supplied to the reference voltage generator 1 and the error amplifier 2. Also, the control transistor T1 is turned off by the source voltage outputted from the external voltage source +Vcc. Further, since the control transistor T1 is turned off and the switching transistor T9 is turned on, the two diodes D1 and D2 of the diode circuit 4 are turned on.

Accordingly, when the load circuit 3 does not require the above-mentioned relatively large current, the source voltage outputted from the external voltage source +Vcc is applied to the load circuit 3 through the diode circuit 4. At that time, a relatively small current flows from the external voltage source +Vcc through the load circuit 3 to ground. It is to be noted that the output voltage to be applied to the load circuit 3 is a difference voltage between a forward drop voltage induced across the diode circuit 4 and the source voltage outputted from the external voltage source +Vcc, which is obtained by subtracting the sum of the forward drop voltages induced across the diodes D1 and D2 from the above source voltage.

In the voltage control circuit 20, when the load circuit 3 does not require the above-mentioned relatively large current, the switching transistors T6 and T7 are turned off, and then, the reference voltage generator 1 and the error amplifier 2 are turned off. Therefore, the above-mentioned useless consumption of the electric power can be prevented. Then, when the voltage control circuit 20 is provided in an IC etc. of a portable electronic apparatus which is driven by a battery, the life of the battery can be lengthened.

In the present preferred embodiment, there is used the switching transistors T6 and T7 each of which is the N type MOSFET, and the switching transistors T8 and T9 each of which is the P type MOSFET. However, the present invention is not limited to this. As the switching transistors T6 to T9, there may be used various kinds of switching active devices such as bipolar transistors, junction type field effect transistors, which are well known to those skilled in the art.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A voltage control circuit for a semiconductor apparatus for controlling an output voltage to be applied from an external voltage source to a load circuit of said semiconductor apparatus therethrough, comprising:

reference voltage generating means for generating a predetermined reference voltage according to a source voltage outputted from an external voltage source;

comparing means for comparing said output voltage to be applied to said load circuit with said reference voltage generated by said reference voltage generating means, and outputting a comparison signal for representing said comparison result thereof;

voltage control means for controlling said output voltage to be applied to said load circuit according to said comparison signal outputted from said comparing means;

diode means for applying said source voltage outputted from said external voltage source to said load circuit in a forward direction thereof, said diode means being connected in parallel with said voltage control means;

first switching means for enabling said reference voltage generating means, said comparing means and said voltage control means in response to a first control signal outputted from an external circuit when said load circuit requires a relatively large current equal to or larger than a predetermined threshold current, and for disabling said reference voltage generating means, said comparing means and said voltage control means in response to a second control signal outputted from said external circuit when said load circuit requires a relatively small current smaller than said predetermined threshold current; and second switching means for enabling said diode means in response to said second control signal, and for disabling said diode means in response to said first control signal.

2. The circuit as claimed in claim 1, wherein said semiconductor apparatus is an integrated circuit to which a chip enable signal is inputted from said external circuit, said first control signal corresponds to said chip enable signal having a first level, and said second control signal corresponds to said chip enable signal having a second level which is different from said first level.

3. The circuit as claimed in claim 1, wherein said first switching means comprises:

a first transistor for controlling the action of said reference signal generating means;

a second transistor for controlling the action of said comparing means; and a third transistor for controlling the action of said voltage control means, and said second switching means comprises a fourth transistor for controlling the action of said diode means.

4. The circuit as claimed in claim 3, wherein said first transistor is an N type metal oxide semiconductor field effect transistor;

said second transistor is an N type metal oxide semiconductor field effect transistor;

said third transistor is a P type metal oxide semiconductor field effect transistor; and said fourth transistor is a P type metal oxide semiconductor field effect transistor.

5. The circuit as claimed in claim 2, wherein said first switching means comprises:

a first transistor for controlling the action of said reference signal generating means;

a second transistor for controlling the action of said comparing means; and a third transistor for controlling the action of said voltage control means, and said second switching means comprises a fourth transistor for controlling the action of said diode means.

6. The circuit as claimed in claim 5, wherein said first transistor is an N type metal oxide semiconductor field effect transistor;

said second transistor is an N type metal oxide semiconductor field effect transistor;

said third transistor is a P type metal oxide semiconductor field effect transistor; and said fourth transistor is a P type metal oxide semiconductor field effect transistor.

7. The circuit as claimed in claim 1, wherein said comparing means is an error amplifier, and said voltage control means is a field effect transistor.

8. The circuit as claimed in claim 2, wherein said comparing means is an error amplifier, and said voltage control means is a field effect transistor.

* * * * *